(12) United States Patent
Xiao et al.

(10) Patent No.: US 10,770,487 B2
(45) Date of Patent: Sep. 8, 2020

(54) METHOD FOR MANUFACTURING LTPS TYPE TFT

(71) Applicant: Wuhan China Star Optoelectronics Technology Co., Ltd., Wuhan (CN)

(72) Inventors: Juncheng Xiao, Wuhan (CN); Chao Tian, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/086,019

(22) PCT Filed: Aug. 7, 2018

(86) PCT No.: PCT/CN2018/099101
§ 371 (c)(1),
(2) Date: Sep. 18, 2018

(87) PCT Pub. No.: WO2019/205340
PCT Pub. Date: Oct. 31, 2019

(65) Prior Publication Data
US 2019/0333944 A1    Oct. 31, 2019

(30) Foreign Application Priority Data
Apr. 28, 2018    (CN) .......................... 2018 1 0396846

(51) Int. Cl.
*H01L 27/12*    (2006.01)
*H01L 29/66*    (2006.01)
*H01L 29/786*    (2006.01)

(52) U.S. Cl.
CPC ........ *H01L 27/1288* (2013.01); *H01L 27/127* (2013.01); *H01L 27/1222* (2013.01); *H01L 29/66757* (2013.01); *H01L 29/78633* (2013.01); *H01L 29/78645* (2013.01); *H01L 29/78675* (2013.01)

(58) Field of Classification Search
CPC ......... H01L 29/66757; H01L 29/78621; H01L 29/78633; H01L 29/41733; H01L 29/4175; H01L 29/41766; H01L 29/41775; H01L 29/78645; H01L 29/78675; H01L 27/1222; H01L 27/124; H01L 27/1288; H01L 27/127
See application file for complete search history.

(56) References Cited

U.S. PATENT DOCUMENTS

| | | | |
|---|---|---|---|
| 9,543,443 B2* | 1/2017 | Sun | H01L 27/124 |
| 9,721,976 B2* | 8/2017 | Hsin | H01L 27/124 |
| 2002/0039813 A1* | 4/2002 | Yamazaki | H01L 29/66757 |
| | | | 438/151 |
| 2004/0241924 A1* | 12/2004 | Chen | H01L 29/41733 |
| | | | 438/197 |

* cited by examiner

*Primary Examiner* — Laura M Menz
*Assistant Examiner* — Candice Chan

(57) ABSTRACT

The present disclosure provides an LTPS type TFT and a method for manufacturing the same. The TFT includes a first contact hole and a second contact hole, where the first contact hole and the second contact hole pass through the third insulating layer, the second insulating layer, and a portion of the first insulating layer, such that a portion of the heavily doped area is exposed. In addition, a transparent electrode is electrically connected to the source/drain electrode or the second gate electrode and a portion of the heavily doped area.

12 Claims, 9 Drawing Sheets

METHOD FOR MANUFACTURING LTPS TYPE TFT

RELATED APPLICATIONS

This application is a National Phase of PCT Patent Application No. PCT/CN2018/099101 having International filing date of Aug. 7, 2018, which claims the benefit of priority of Chinese Patent Application No. 201810396846.X filed on Apr. 28, 2018. The contents of the above applications are all incorporated by reference as if fully set forth herein in their entirety.

FIELD AND BACKGROUND OF THE INVENTION

The present disclosure relates to the field of flat panel display technology, and more particularly to an LTPS type TFT and a method for manufacturing the same.

Low temperature polysilicon (LTPS) has advantage of high electron mobility, which effectively helps reduce an area of a thin film transistor (TFT), and thus increases pixel aperture ratio of display panels. Brightness of display panels is increased, while power consumption of panels is reduced. This is helpful in decreasing manufacturing costs of panels as well. Therefore, LTPS and method for manufacturing the same have become one of the mainstream techniques used for field of liquid crystal display.

However, conventional methods for manufacturing LTPS are complicated. There are as many as ten or more film layers formed on an array substrate. Many mask processes are needed to form these films. This not only prolongs display panel manufacturing time, but also results in high manufacturing cost and high operation cost for formation thereof.

For this reason, panel manufacturers endeavor to shorten array substrate manufacturing periods, increase product manufacturing yields, increase product manufacturing efficiency, and decrease product manufacturing costs.

In the prior art, TFT generally includes a metal layer. Using a mask to form a through-hole is required in order to make electrical connection between the metal layer and a polysilicon layer, and using another mask to form another through-hole is also required in order to make electrical connection between the metal layer and a pixel electrode. Thus, according to the prior art, many masks are required to achieve electrical connection among layers in the manufacturing process of LTPS type TFT. The subject invention provides a technical scheme to solve this problem.

SUMMARY OF THE INVENTION

The present disclosure provides an LTPS type TFT and a method for manufacturing the same to solve the problem encountered by the prior art, where the method for manufacturing an LTPS type TFT is complicated.

To solve the aforementioned problem, the present disclosure provides the following technical schemes.

The present disclosure provides a method for manufacturing a low temperature poly silicon (LTPS) type thin film transistor (TFT), comprising steps of:

providing a substrate, and forming a silicon channel layer on the substrate;

forming a first insulating layer on the silicon channel layer;

forming a first gate electrode of the TFT on the first insulating layer;

performing an ion implantation on a portion of the silicon channel layer to form a doped area, wherein the doped area includes a lightly doped area and a heavily doped area, and the heavily doped area includes a first heavily doped area and a second heavily doped area;

forming a second insulating layer, a source/drain electrode, and a third insulating layer on the first gate electrode;

forming a first contact hole on the LTPS type TFT, wherein the first contact hole exposes a portion of the source/drain electrode and a portion of the doped area; and forming a first transparent electrode on the third insulating layer, wherein the first transparent electrode is electrically connected to the source/drain electrode and the first heavily doped area.

In accordance with one preferred embodiment of the present disclosure, the step of forming the silicon channel layer on the substrate comprises:

providing the substrate, and forming a light-shielding film on the substrate;

patterning the light-shielding film to form a light-shielding layer;

forming a buffer layer on the light-shielding layer;

forming a silicon channel film on the buffer layer; and patterning the silicon channel film to form the silicon channel layer.

In accordance with one preferred embodiment of the present disclosure, the first contact hole passes through the third insulating layer, the second insulating layer, and a portion of the first insulating layer, such that the first heavily doped area is exposed.

In accordance with one preferred embodiment of the present disclosure, the LTPS type TFT further comprises a second contact hole, and the second contact hole passes through the third insulating layer, the second insulating layer, and a portion of the first insulating layer, such that the second heavily doped area is exposed.

In accordance with one preferred embodiment of the present disclosure, the LTPS type TFT further comprises a second gate electrode, and the second gate electrode and the first gate electrode are made of a same metal.

In accordance with one preferred embodiment of the present disclosure, the LTPS type TFT further comprises a second transparent electrode; and wherein the second contact hole exposes a portion of the second gate electrode and the second heavily doped area, and the second gate electrode is electrically connected to a portion of the heavily doped area via the second transparent electrode.

Additionally, the present disclosure provides a low temperature poly silicon (LTPS) type thin film transistor (TFT), comprising:

a substrate;

a light-shielding layer disposed on the substrate;

a buffer layer disposed on the light-shielding layer;

a silicon channel layer disposed on the buffer layer, wherein the silicon channel layer includes a lightly doped area and a heavily doped area formed by an ion implantation;

a first insulating layer disposed on the silicon channel layer;

a first gate electrode disposed on the first insulating layer;

a second insulating layer disposed on the first gate electrode;

a source/drain electrode disposed on the second insulating layer;

a third insulating layer disposed on the source/drain electrode;

a first contact hole passing through the third insulating layer, the second insulating layer, and a portion of the first insulating layer, and configured to expose a portion of the heavily doped area; and a first transparent electrode disposed on the third insulating layer, wherein the first transparent electrode is electrically connected to the source/drain electrode and the heavily doped area.

In accordance with one preferred embodiment of the present disclosure, the LTPS type TFT further comprises a second gate electrode, and the second gate electrode and the first gate electrode are made of a same metal.

In accordance with one preferred embodiment of the present disclosure, the LTPS type TFT further comprises a second contact hole, wherein the second contact hole passes through the third insulating layer, the second insulating layer, and a portion of the first insulating layer, such that a portion of the heavily doped area and a portion of the second gate electrode are exposed; and the second gate electrode is electrically connected to a portion of the heavily doped area via the second transparent electrode.

The present disclosure further provides a method for manufacturing a low temperature poly silicon (LTPS) type thin film transistor (TFT), comprising steps of:

providing a substrate and forming a silicon channel layer on the substrate;

forming a first insulating layer on the silicon channel layer;

forming a first gate electrode of the TFT on the first insulating layer;

performing an ion implantation on a portion of the silicon channel layer to form an doped area;

forming a second insulating layer, a source/drain electrode, and a third insulating layer on the first gate electrode;

forming a first contact hole on the LTPS type TFT, wherein the first contact hole exposes a portion of the source/drain electrode and a portion of the doped area; and forming a first transparent electrode on the third insulating layer, wherein the first transparent electrode is electrically connected to the source/drain electrode and the silicon channel layer.

In accordance with one preferred embodiment of the present disclosure, the step of forming the silicon channel layer on the substrate comprises:

providing the substrate, and forming a light-shielding film on the substrate;

patterning the light-shielding film to form a light-shielding layer;

forming a buffer layer on the light-shielding layer;

forming a silicon channel film on the buffer layer; and patterning the silicon channel film to form the silicon channel layer.

In accordance with one preferred embodiment of the present disclosure, the first contact hole passes through the third insulating layer, the second insulating layer, and a portion of the first insulating layer, such that the first heavily doped area and a portion of the source/drain electrode are exposed.

In accordance with one preferred embodiment of the present disclosure, the LTPS type TFT further comprises a second contact hole, and the second contact hole passes through the third insulating layer, the second insulating layer, and a portion of the first insulating layer, such that the second heavily doped area and a portion of the second gate electrode are exposed.

In accordance with one preferred embodiment of the present disclosure, the LTPS type TFT further comprises a second gate electrode, and the second gate electrode and the first gate electrode are made of a same metal.

In accordance with one preferred embodiment of the present disclosure, the LTPS type TFT further comprises a second transparent electrode; and wherein the second contact hole exposes a portion of the second gate electrode and the second heavily doped area, and the second gate electrode is electrically connected to a portion of the heavily doped area via the second transparent electrode.

According to the present disclosure, the TFT includes a first contact hole and a second contact hole, where the first contact hole and the second contact hole pass through the third insulating layer, the second insulating layer, and a portion of the first insulating layer, such that a portion of the heavily doped area is exposed. In addition, a transparent electrode is electrically connected to the source/drain electrode or the second gate electrode and a portion of the heavily doped area. Therefore, quantity of masks used to form the contact hole is reduced, decreasing manufacturing time of a panel and decreasing manufacturing cost thereof.

BRIEF DESCRIPTION OF THE SEVERAL VIEWS OF THE DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DESCRIPTION OF SPECIFIC EMBODIMENTS OF THE INVENTION

Figure 1:
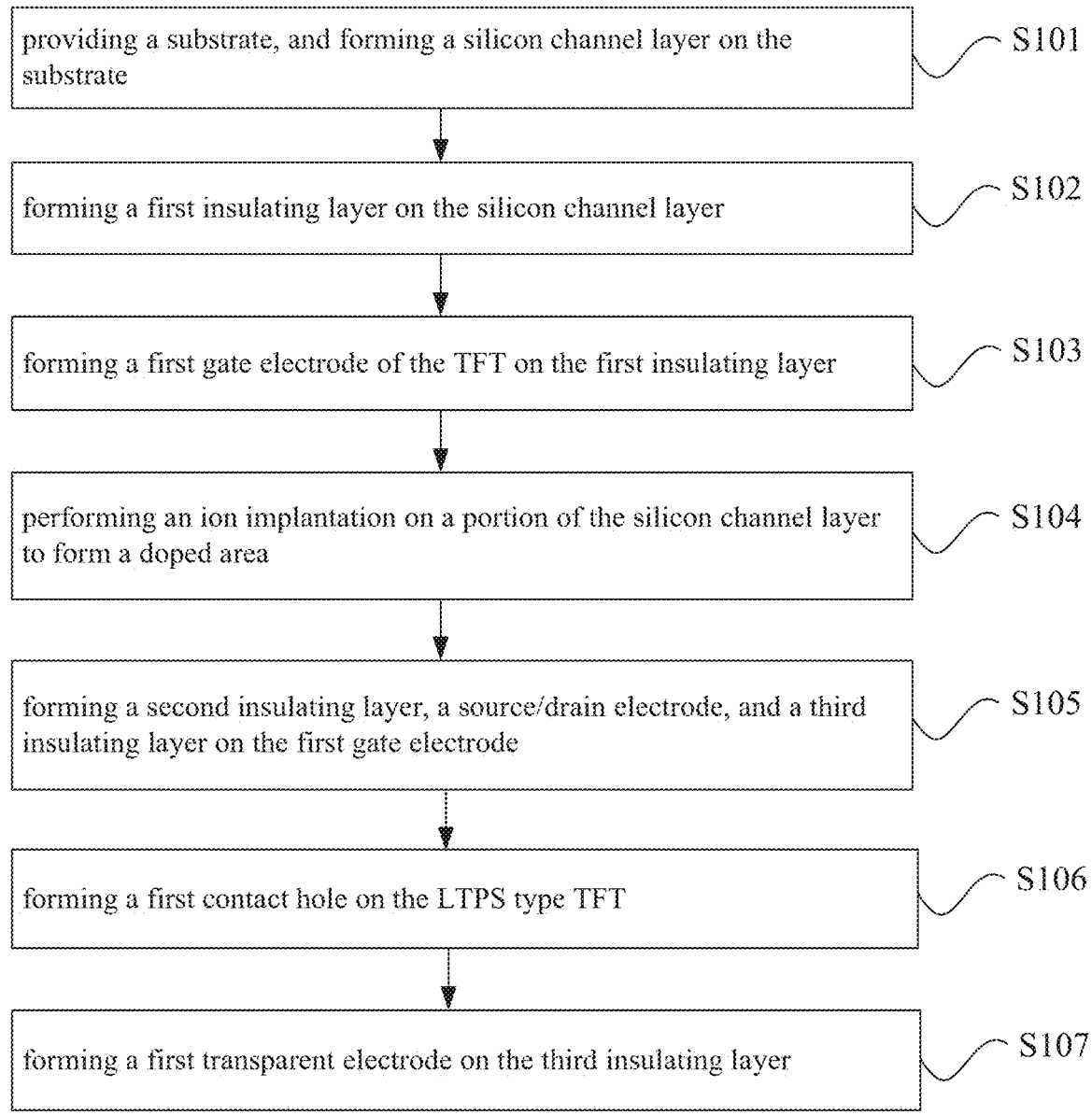
FIG. 1 shows a flowchart of a method for manufacturing an LTPS type TFT according to a first embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Embodiment 1

FIG. 1 shows a flowchart of a method for manufacturing a low temperature poly silicon (LTPS) type thin film transistor (TFT) according to a first embodiment of the present disclosure. The method includes the following steps.

In a step S101, a substrate 101 is provided, and a silicon channel layer 104 is formed on the substrate 101.

Figure 2A:
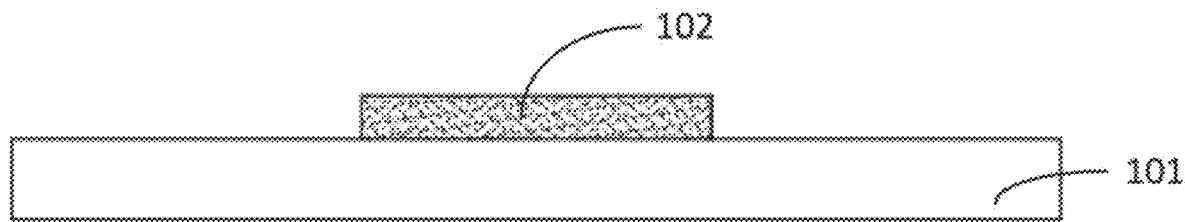
FIGS. 2A, 2B, 2C, 2D, 2E, 2F, and 2G show a process flow of a method for manufacturing an LTPS type TFT according to a first embodiment of the present disclosure.
Figure 2B:
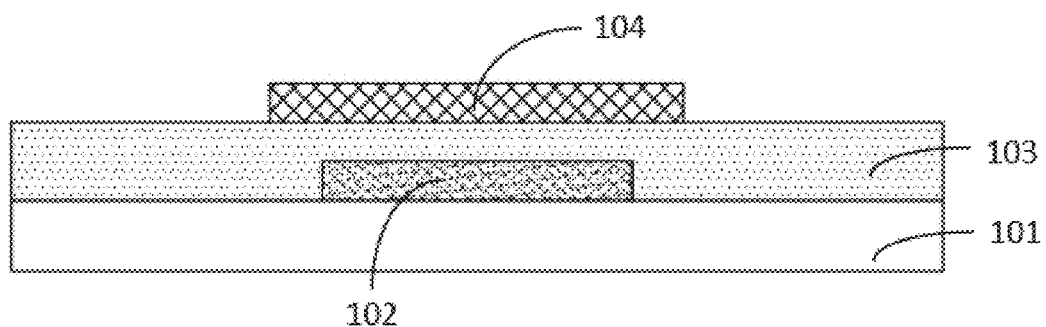

Specifically, as shown in FIGS. 2A-2B, this step includes the following steps.

In a step S1011, a substrate 101 is provided, and then a light-shielding film is formed on the substrate 101.

The substrate 101 can be a glass substrate, a silicon substrate, or a resin substrate.

The light-shielding film is made of a black light-shielding material, but is not limited thereto.

In a step S1012, the light-shielding film is patterned to form a light-shielding layer 102.

Specifically, a first mask process is performed on the light-shielding film. That is, a first photoresist layer (not shown) is formed on the light-shielding film first, and then a mask (not shown) is used to perform an exposure treatment. Next, after a development treatment and a first etching process are carried out, the light-shielding film is patterned to form the light-shielding layer 102, as shown in FIG. 2A. Finally, the first photoresist layer is removed.

In a step S1013, a buffer layer 103 is formed on the light-shielding layer 102.

In a step S1014, a silicon channel film is formed on the buffer layer 103.

In a step S1015, the silicon channel film is patterned to form the silicon channel layer 104.

In one preferred embodiment, the silicon channel film is made of polysilicon. A second mask process is performed on the silicon channel film. That is, a second photoresist layer (not shown) is formed on the silicon channel film first, and then a mask (not shown) is used to perform an exposure treatment. Next, after a development treatment and a second etching process are carried out, the silicon channel film is patterned to form the silicon channel layer 104, as shown in FIG. 2B. Finally, the second photoresist layer is removed.

In a step S102, a first insulating layer 105 is formed on the silicon channel layer.

In one preferred embodiment, the first insulating layer 105 is a gate insulating layer. The gate insulating layer covers the silicon channel layer 104. The gate insulating layer is configured to isolate the silicon channel layer 104 from other metal layers. Preferably, the gate insulating layer is made of silicon nitride, silicon oxide, or silicon oxynitride.

In a step S103, a first gate electrode 106 of the TFT is formed on the first insulating layer 105.

Specifically, a first metal layer is formed on the first insulating layer 105 first. The first metal layer can be made of molybdenum, aluminum, aluminum-nickel alloy, molybdenum-tungsten alloy, chromium, copper, or any combination thereof.

Figure 2C:
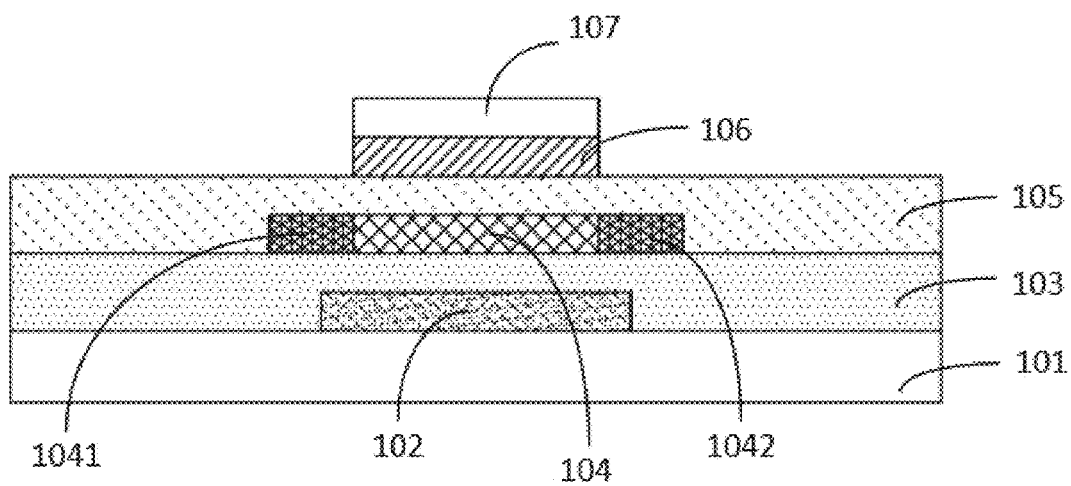

Thereafter, a third mask process is performed on the first metal layer. That is, a third photoresist layer 107 is formed on the first metal layer first, and then a mask (not shown) is used to perform an exposure treatment. Next, after a development treatment and a third etching process are carried out, the first metal layer is patterned to form the first gate electrode 106 of the TFT, as shown in FIG. 2C. The third photoresist layer 107 is retained.

In a step S104, an ion implantation is performed on a portion of the silicon channel layer 104 to form a doped area.

Figure 2D:
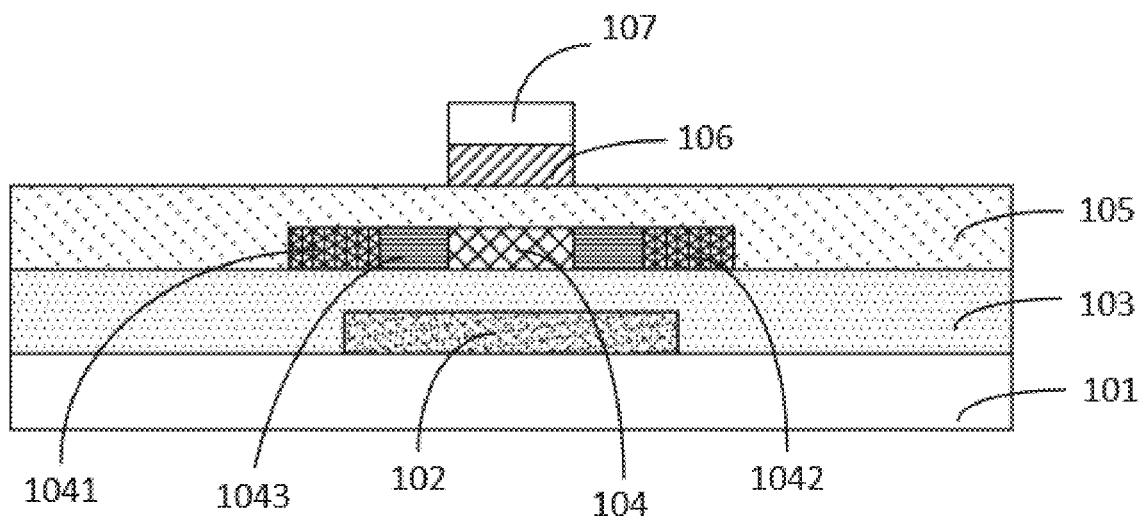

Specifically, as shown in FIGS. 2C-2D, this step includes the following steps.

In a step S1041, a first ion implantation is performed on a portion of the silicon channel layer 104 to form a heavily doped area 1041 and 1042.

In this step, the third photoresist layer 107 and the first gate electrode 106 server as a barrier layer, and a first ion implantation is performed on the silicon channel layer 104 to form a heavily doped area. In one preferred embodiment, the implanted ions are high concentration of $N^+$ ions. The doped area is a heavily doped area 1041 and 1042. The heavily doped area includes a first heavily doped area 1041 and a second heavily doped area 1042, which are disposed at two ends of the silicon channel layer 104, as shown in FIG. 2C.

In a step S1042, an exposure treatment and a development treatment are carried out on the third photoresist layer 107, and the first gate electrode 106 is patterned by a fourth etching process.

This step is performed for etching the first gate electrode 106 in order to reduce area occupied by the first gate electrode 106. In other words, a mask process is required to be carried out for the third photoresist layer 107.

In a step S1043, a second ion implantation is performed on a portion of the silicon channel layer 104 to form a lightly doped area 1043.

In this step, the third photoresist layer 107 and the first gate electrode 106 after being further patterned server as a barrier layer, and a second ion implantation is performed on the silicon channel layer 104 to form a lightly doped area 1043. The lightly doped area 1043 is disposed between the heavily doped area 1041 and 1042 and the silicon channel layer 104. In one preferred embodiment, the implanted ions are high concentration of $N^-$ ions, as shown in FIG. 2D.

In a step S1044, the third photoresist layer 107 is removed.

For formation of the third photoresist layer 107, a halftone mask could be used for the third photoresist layer, so as to form the third photoresist layer 107 having different thicknesses after being developed. The area of the photoresist layer having smaller thickness corresponds to the lightly doped area 1043, and the area of the photoresist layer having larger thickness corresponds to the silicon channel layer 104 that is not doped by ion implantation.

After the heavily doped area 1041 and 1042 are doped by ion implantation, an oxygen plasma ashing treatment is carried out on the third photoresist layer 107, so that the area of the photoresist layer having larger thickness is thinned, and the area of the photoresist layer having smaller thickness is removed, so as to form a pattern of the photoresist layer as shown in FIG. 2D. Thereafter, a second etching process is carried out on the first gate electrode 106.

In a step S105, a second insulating layer 108, a source/drain electrode 109, and a third insulating layer 110 are formed on the first gate electrode 106.

Figure 2E:
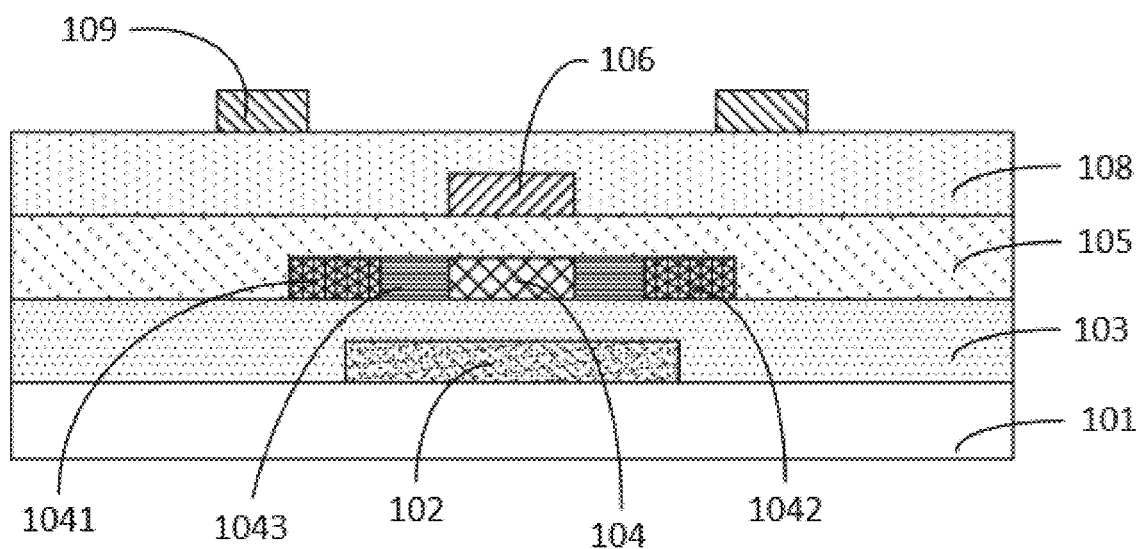
Figure 2F:
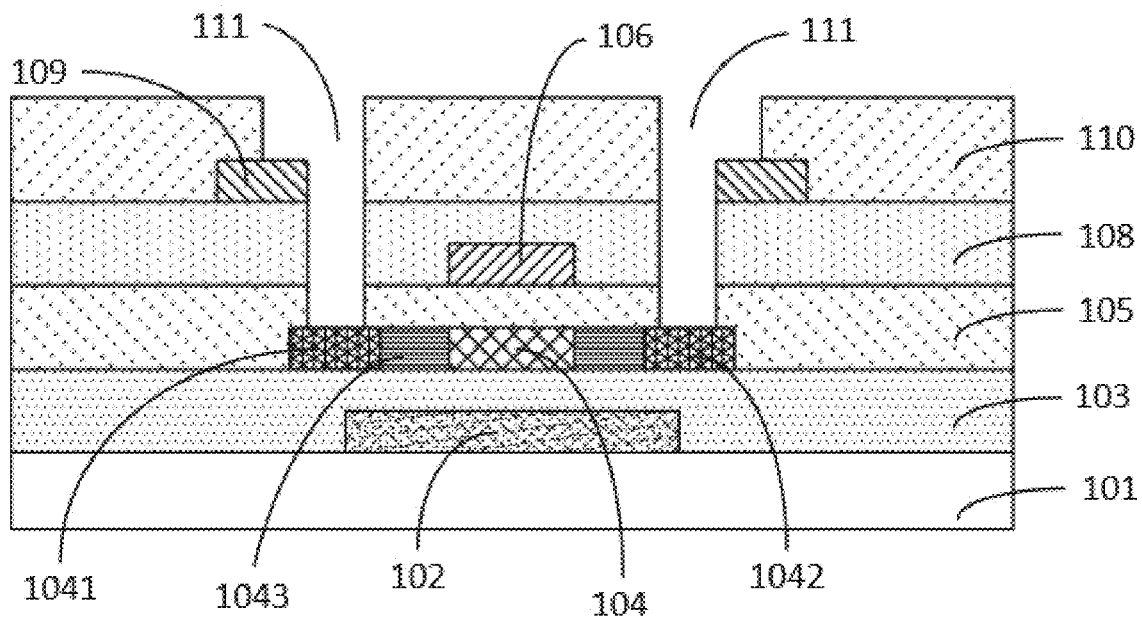

Specifically, as shown in FIGS. 2E-2F, this step includes the following steps.

In a step S1051, a second insulating layer 108 is formed on the first gate electrode 106.

In a step S1052, a source/drain electrode 109 is formed on the second insulating layer 108.

In a step S1053, a third insulating layer 110 is formed on the source/drain electrode 109.

The second insulating layer 108 formed is an interdielectric layer, which covers the first gate electrode 106, and is configured to isolate the first gate electrode 106 from the source/drain electrode 109.

Then, a second metal layer is formed on the second insulating layer 108. The second metal layer can be made of molybdenum, aluminum, aluminum-nickel alloy, molybdenum-tungsten alloy, chromium, copper, titanium-aluminum alloy, or any combinations thereof.

Thereafter, a fourth mask process is performed on the second metal layer. That is, a fourth photoresist layer (not shown) is formed on the second metal layer first, and then a mask (not shown) is used to perform an exposure treatment. Next, after a development treatment and a fifth etching process are carried out, the second metal layer is patterned to form the source/drain electrode 109 of the TFT, as shown in FIG. 2E. Then, the fourth photoresist layer is removed. Finally, a third insulating layer 110 is formed on the source/drain electrode 109. The third insulating layer 110 serves as a planarization layer.

In a step S106, a first contact hole 111 is formed on the LTPS type TFT, where the first contact hole 111 exposes a portion of the source/drain electrode 109 and a portion of the doped area.

Specifically, as shown in FIG. 2F, an etching process is carried out on the TFT to form a contact hole 111. The contact hole 111 passes through the third insulating layer 110, the second insulating layer 108, and a portion of the first insulating layer 105, and exposes the first heavily doped area 1041 or the second heavily doped area 1042 and a portion of the source/drain electrode 109. Since the first insulating layer 105, the second insulating layer 108, and the third insulating layer 110 are made of generally the same material, only a single one etching process is required to form the first contact hole 111.

In a step S107, a first transparent electrode 112 is formed on the third insulating layer 110, where the first transparent electrode is electrically connected to the source/drain electrode 109 and the silicon channel layer 104.

Figure 2G:
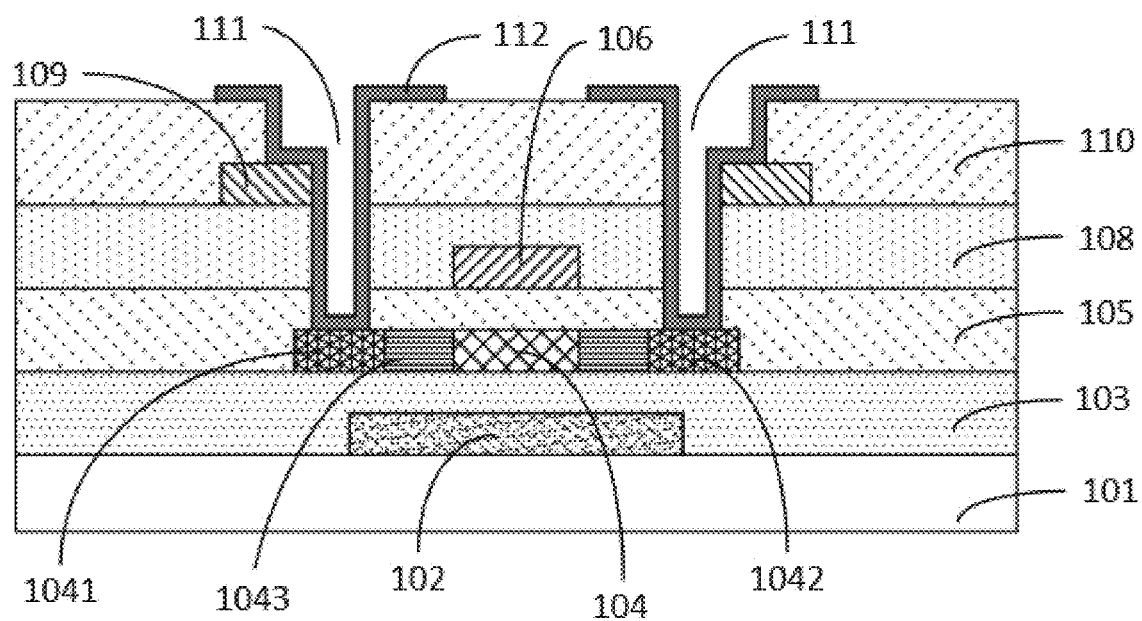

Specifically, as shown in FIG. 2G, a first transparent electrode 112 is formed on the third insulating layer 110. The first transparent electrode 112 is electrically connected to the source/drain electrode 109 and the first heavily doped area 1041 or the second heavily doped area 1042 via the first contact hole 111.

According to the present disclosure, a single one etching process is carried out to form the first contact hole passing through the third insulating layer, the second insulating layer, and a portion of the first insulating layer. In addition, the position of the source/drain electrode is adequately adjusted to have the source/drain electrode not cover the heavily doped area. The first transparent electrode is electrically connected to the source/drain electrode and the first heavily doped area or the second heavily doped area via the first contact hole 111. Therefore, quantity of masks used to form the contact hole is reduced, decreasing manufacturing time of a panel and decreasing manufacturing cost thereof.

Embodiment 2

Figure 3:
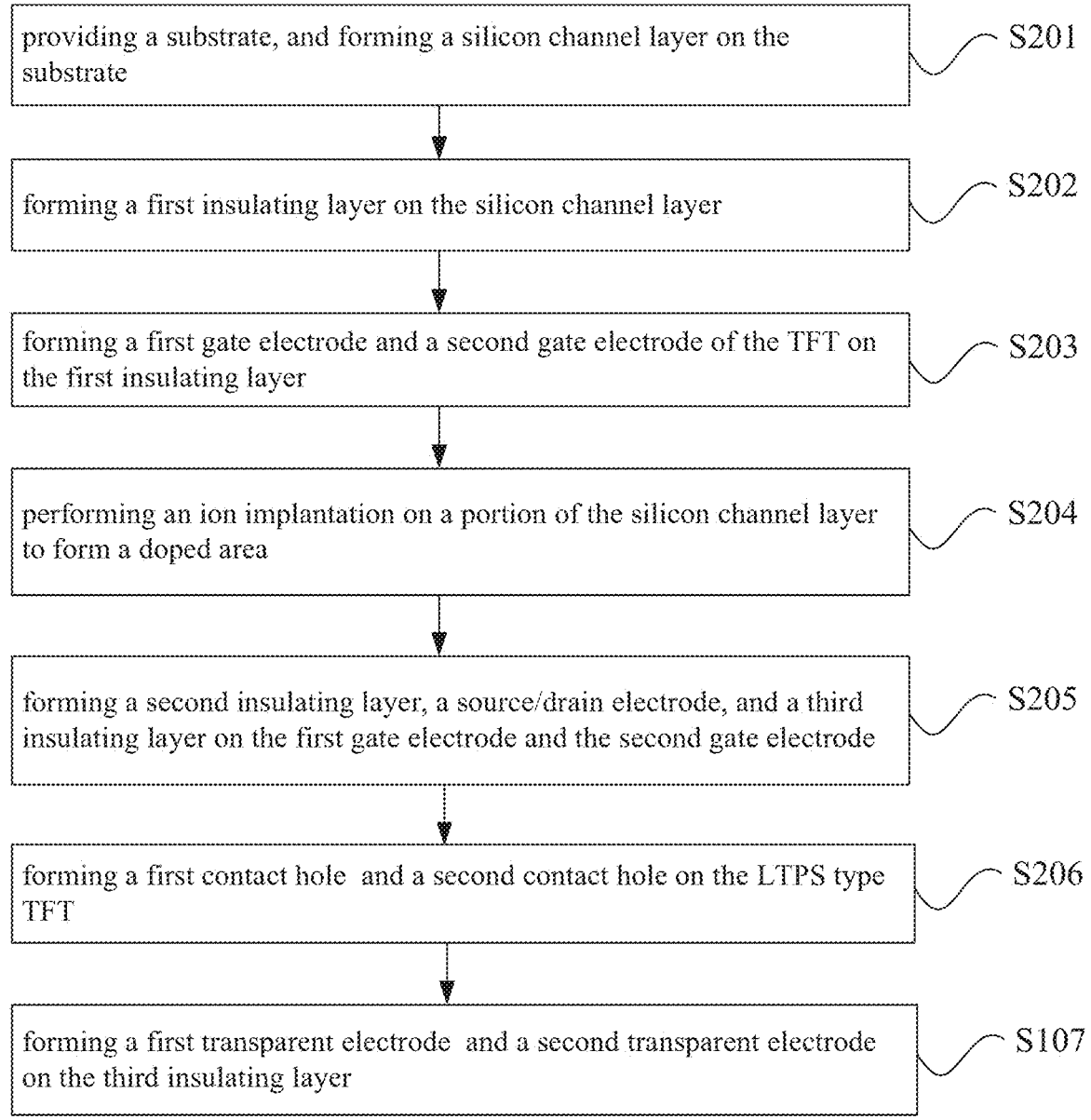
FIG. 3 shows a flowchart of a method for manufacturing an LTPS type TFT according to a second embodiment of the present disclosure.

FIG. 3 shows a flowchart of a method for manufacturing a low temperature poly silicon (LTPS) type thin film transistor (TFT) according to a second embodiment of the present disclosure. The method includes the following steps.

In a step S201, a substrate 201 is provided, and a silicon channel layer 204 is formed on the substrate 201.

Figure 4A:
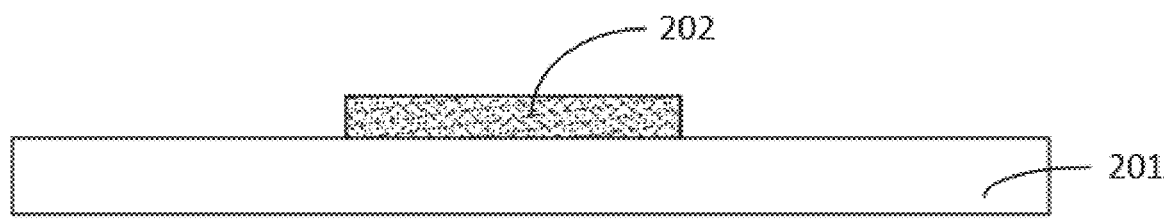
FIGS. 4A, 4B, 4C, 4D, 4E, 4F, and 4G show a process flow of a method for manufacturing an LTPS type TFT according to a second embodiment of the present disclosure.
Figure 4B:
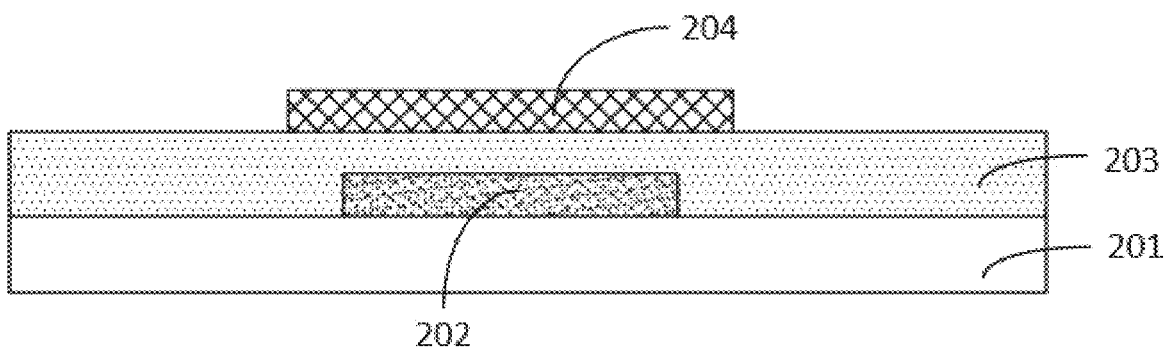

Specifically, as shown in FIGS. 4A-4B, this step includes the following steps.

In a step S2011, a substrate 201 is provided, and then a light-shielding film is formed on the substrate 201.

In a step S2012, the light-shielding film is patterned to form a light-shielding layer 202.

In a step S2013, a buffer layer 203 is formed on the light-shielding layer 202.

In a step S2014, a silicon channel film is formed on the buffer layer 203.

In a step S2015, the silicon channel film is patterned to form the silicon channel layer 204.

In a step S202, a first insulating layer 205 is formed on the silicon channel layer 204.

In the present embodiment, the steps S201 and S202 are the same as the steps S101 and S102 of EMBODIMENT 1, and thus description thereof is omitted to avoid redundancy.

In a step S203, a first gate electrode 206 and a second gate electrode 207 of the TFT are formed on the first insulating layer 205.

Specifically, a first metal layer is formed on the first insulating layer 205 first. The first metal layer can be made of molybdenum, aluminum, aluminum-nickel alloy, molybdenum-tungsten alloy, chromium, copper, or any combinations thereof.

Figure 4C:
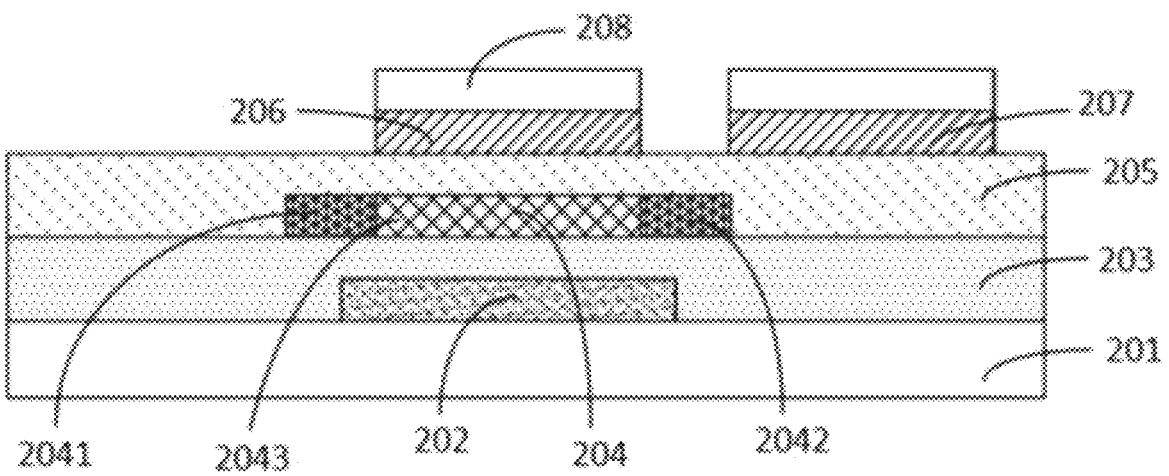

Thereafter, a third mask process is performed on the first metal layer. That is, a third photoresist layer 208 is formed on the first metal layer first, and then a mask (not shown) is used to perform an exposure treatment. Next, after a development treatment and a third etching process are carried out, the first metal layer is patterned to form the first gate electrode 206 and the second gate electrode 207 of the TFT, as shown in FIG. 4C. The third photoresist layer 208 on the first gate electrode 206 and the second gate electrode 207 is retained.

In a step S204, an ion implantation is performed on a portion of the silicon channel layer 204 to form a doped area.

Figure 4D:
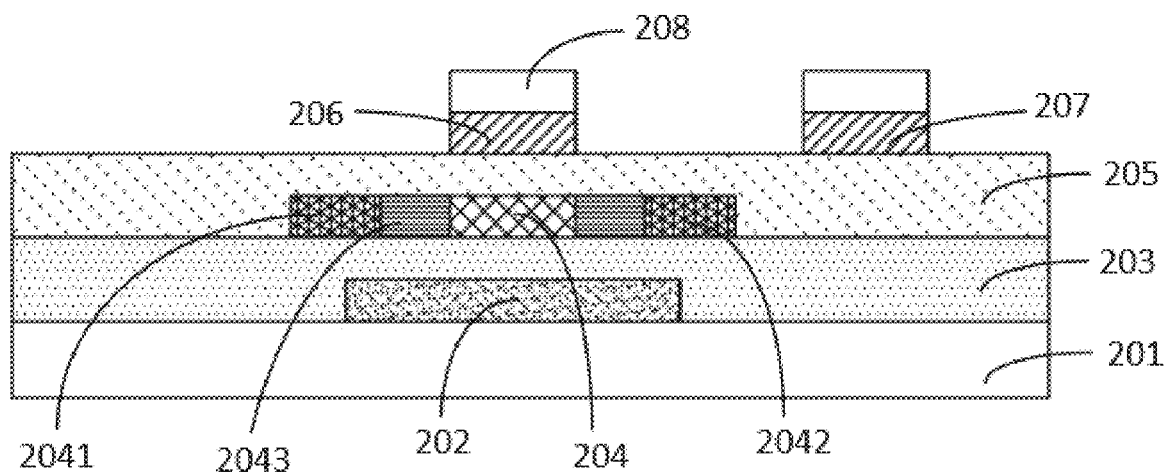

Specifically, as shown in FIGS. 4C-4D, this step includes the following steps.

In a step S2041, a first ion implantation is performed on a portion of the silicon channel layer 204, which is not blocked by the first gate electrode 206, to form a heavily doped area 2041 and 2042.

In a step S2042, an exposure treatment and a development treatment are carried out on the third photoresist layer 208, and the first gate electrode 206 is patterned by a fourth etching process.

In a step S2043, a second ion implantation is performed on a portion of the silicon channel layer 204, which is not blocked by the first gate electrode 206 after the first gate electrode 206 is patterned, to form a lightly doped area 2043.

In a step S2044, the third photoresist layer 208 is removed.

In a step S205, a second insulating layer 209, a source/drain electrode 210, and a third insulating layer 211 are formed on the first gate electrode 206 and the second gate electrode 207.

Figure 4E:
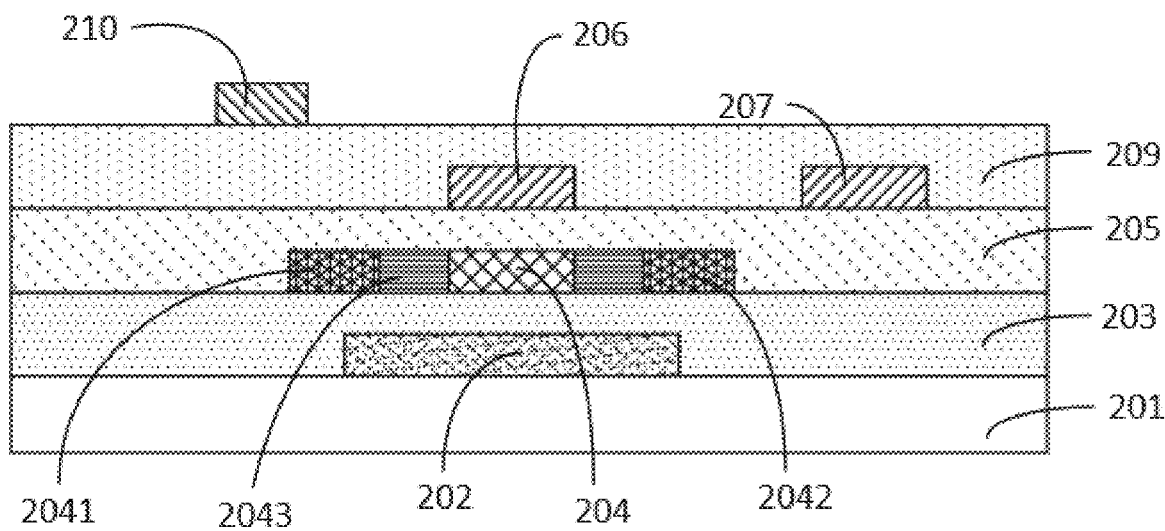

Specifically, as shown in FIG. 4E, this step includes the following steps.

In a step S2051, a second insulating layer 209 is formed on the first gate electrode 206 and the second gate electrode 207.

In a step S2052, a source/drain electrode 210 is formed on the second insulating layer 209.

In a step S2053, a third insulating layer 211 is formed on the source/drain electrode 210.

In the present embodiment, the steps S204 and S205 are the same as the steps S104 and S105 of EMBODIMENT 1, and thus description thereof is omitted to avoid redundancy.

In a step S206, a first contact hole 212 and a second contact hole 213 are formed on the LTPS type TFT, where the first contact hole 212 exposes a portion of the source/drain electrode 210 and a portion of the doped area, and the second contact hole 213 exposes a portion of the second gate electrode 207 and a portion of the doped area.

Figure 4F:
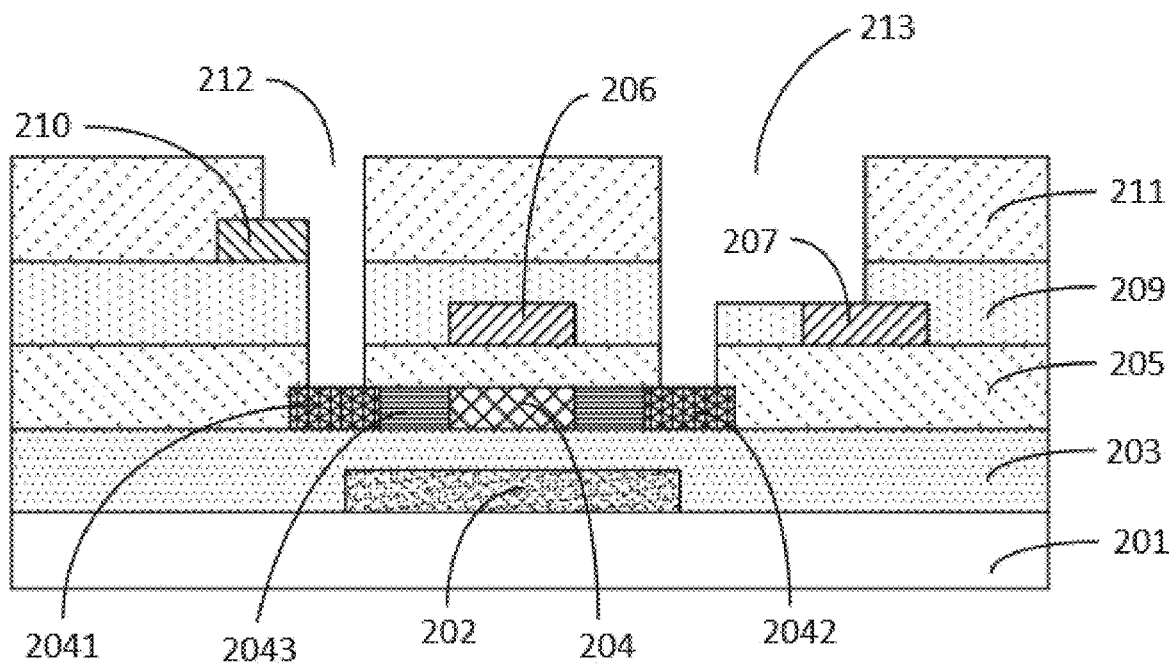

Specifically, as shown in FIG. 4F, an etching process is carried out on the TFT to form a first contact hole 212 and a second contact hole 213.

The first contact hole 212 passes through the third insulating layer 211, the second insulating layer 209, and a portion of the first insulating layer 205, and exposes the first heavily doped area 2041 and a portion of the source/drain electrode 210.

The second contact hole 213 passes through the third insulating layer 211, the second insulating layer 209, and a portion of the first insulating layer 205, and exposes the second heavily doped area 2042 and a portion of the second gate electrode 207.

Since the first insulating layer 205, the second insulating layer 209, and the third insulating layer 211 are made of generally the same material, only a single one etching process is required to form the first contact hole 212 and the second contact hole 213.

In a step S207, a first transparent electrode 214 and a second transparent electrode 215 are formed on the third insulating layer 211, where the first transparent electrode 214 is electrically connected to the source/drain electrode 210 and the silicon channel layer 204, and the second transparent electrode 215 is electrically connected to the second gate electrode 207 and the silicon channel layer 204.

Figure 4G:
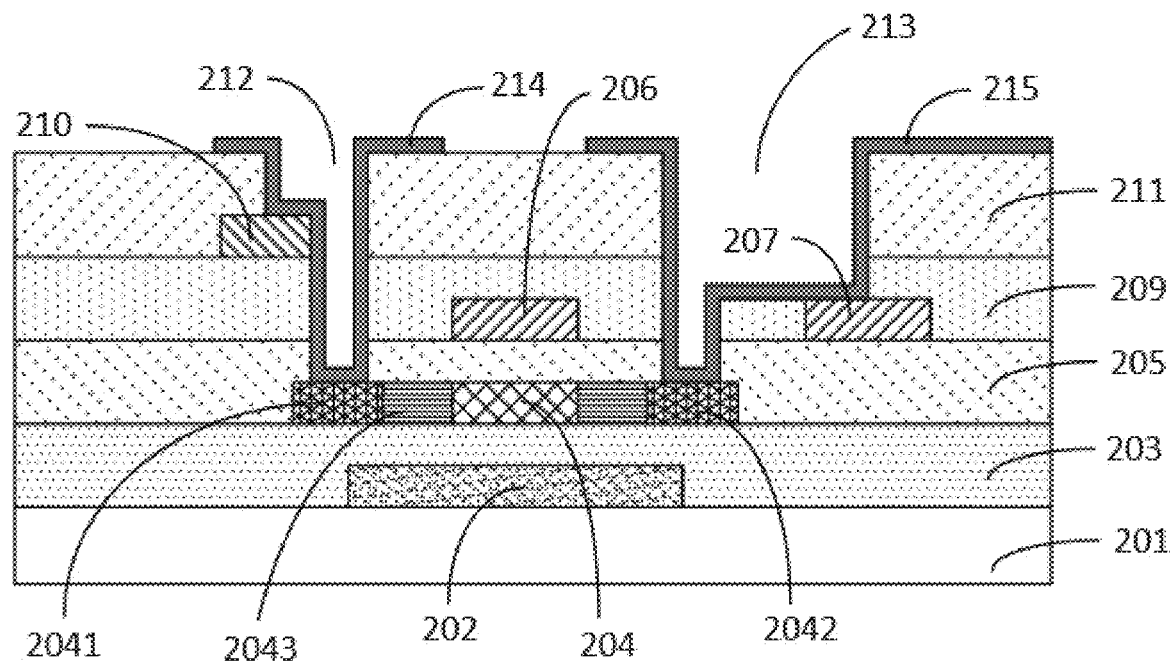

Specifically, as shown in FIG. 4G, a first transparent electrode 214 and a second transparent electrode 215 are formed on the third insulating layer 211.

The first transparent electrode 214 is electrically connected to the source/drain electrode 210 and the first heavily doped area 2041 via the first contact hole 212. The second transparent electrode 215 is electrically connected to the second gate electrode 207 and the second heavily doped area 2042 via the second contact hole 213.

According to the present disclosure, a single one etching process is carried out to form the first contact hole and the second contact hole passing through the third insulating layer, the second insulating layer, and a portion of the first insulating layer. In addition, the first contact hole and the second contact hole expose a portion of the heavily doped area. And, the transparent electrode is electrically connected to the source/drain electrode or the second gate electrode and a portion of the heavily doped area. Therefore, quantity of masks used to form the contact hole is reduced, decreasing manufacturing time of panels and decreasing manufacturing costs thereof.

Figure 5:
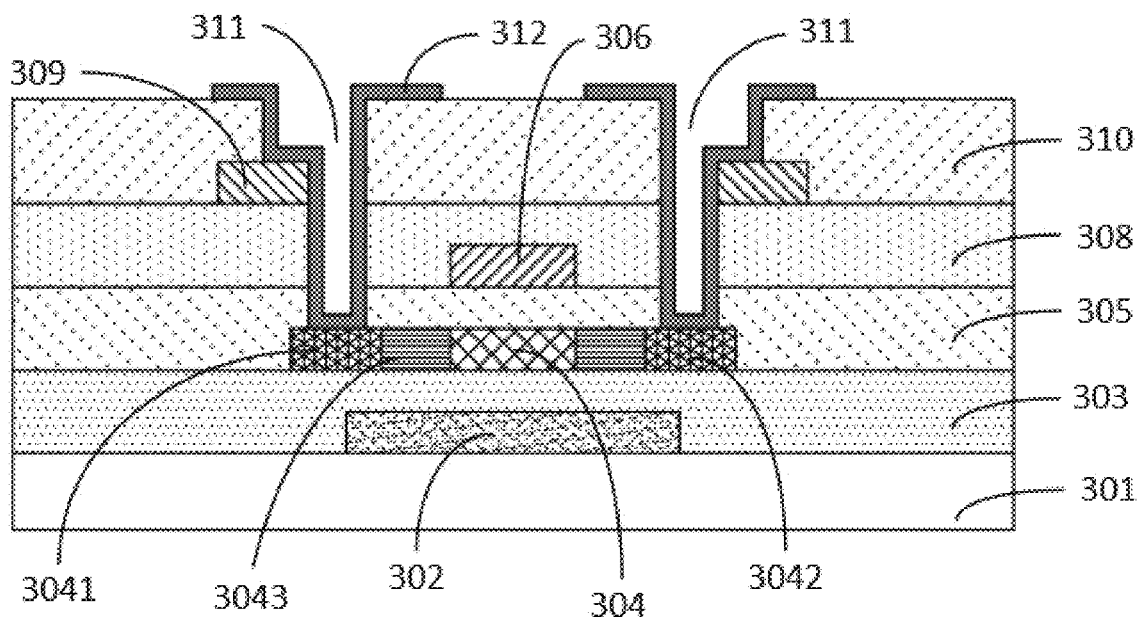
FIG. 5 is a schematic diagram showing a cross-sectional view of a structure of an LTPS type TFT according to a third embodiment of the present disclosure.

FIG. 5 is a schematic diagram showing a cross-sectional view of a structure of an LTPS type TFT according to a third embodiment of the present disclosure. The LTPS type TFT includes a substrate 301, a light-shielding layer 302, a buffer layer 303, a silicon channel layer 304, a first insulating layer 305, a first gate electrode 306, a second insulating layer 308, a source/drain electrode 309, a third insulating layer 310, a first contact hole 311, and a first transparent electrode 312.

The substrate 101 can be a glass substrate, a silicon substrate, or a resin substrate.

The light-shielding layer 302 is formed on the substrate 301. The light-shielding layer 302 is made of a black light-shielding material, but is not limited thereto.

The buffer layer 303 is formed on the light-shielding layer 302.

The silicon channel layer 304 is formed on the buffer layer 303. The silicon channel layer 304 is composed polysilicon.

The silicon channel layer 304 includes a lightly doped area 3043 and a heavily doped area 3041 and 3042 that are doped by ion implantation. The heavily doped area 3041 and 3042 includes a first heavily doped area 3041 and a second heavily doped area 3042, which are disposed at two ends of the silicon channel layer 304. The lightly doped area 3043 is disposed between the silicon channel layer 304 and the heavily doped area 3041 and 3042. The heavily doped area 3041 and 3042 are doped by high concentration of $N^+$ ions, and the lightly doped area 3043 is doped by low concentration of $N^-$ ions.

The first insulating layer 305 is formed on the silicon channel layer 304. The first insulating layer 305 is a gate insulating layer. The gate insulating layer covers the silicon channel layer 304. The gate insulating layer is configured to isolate the silicon channel layer 304 from other metal layers. Preferably, the gate insulating layer is made of silicon nitride, silicon oxide, or silicon oxynitride.

The first gate electrode 306 is formed on the first insulating layer 305. The first gate electrode 306 can be made of molybdenum, aluminum, aluminum-nickel alloy, molybdenum-tungsten alloy, chromium, copper, or any combinations thereof.

The second insulating layer 308 is formed on the first gate electrode 306. The second insulating layer 308 is an interdielectric layer, which covers the first gate electrode 306, and is configured to isolate the first gate electrode 306 from the source/drain electrode 309.

The source/drain electrode 309 is formed on the second insulating layer 308. The source/drain electrode 309 can be made of molybdenum, aluminum, aluminum-nickel alloy, molybdenum-tungsten alloy, chromium, copper, titanium-aluminum alloy, or any combinations thereof.

The third insulating layer 310 is formed on the source/drain electrode 309. The third insulating layer 310 serves as a planarization layer or a passivation layer.

The first contact hole 311 passes through the third insulating layer 310, the second insulating layer 308, and a portion of the first insulating layer 305, and exposes the heavily doped area and a portion of the source/drain electrode 309. Since the first insulating layer 305, the second insulating layer 308, and the third insulating layer 310 are made of generally the same material, only a single one etching process is required to form the first contact hole 311.

The first transparent electrode 312 is formed on the third insulating layer 310. The first transparent electrode 312 is electrically connected to the source/drain electrode 309 and the heavily doped area via the first contact hole 311.

Figure 6:
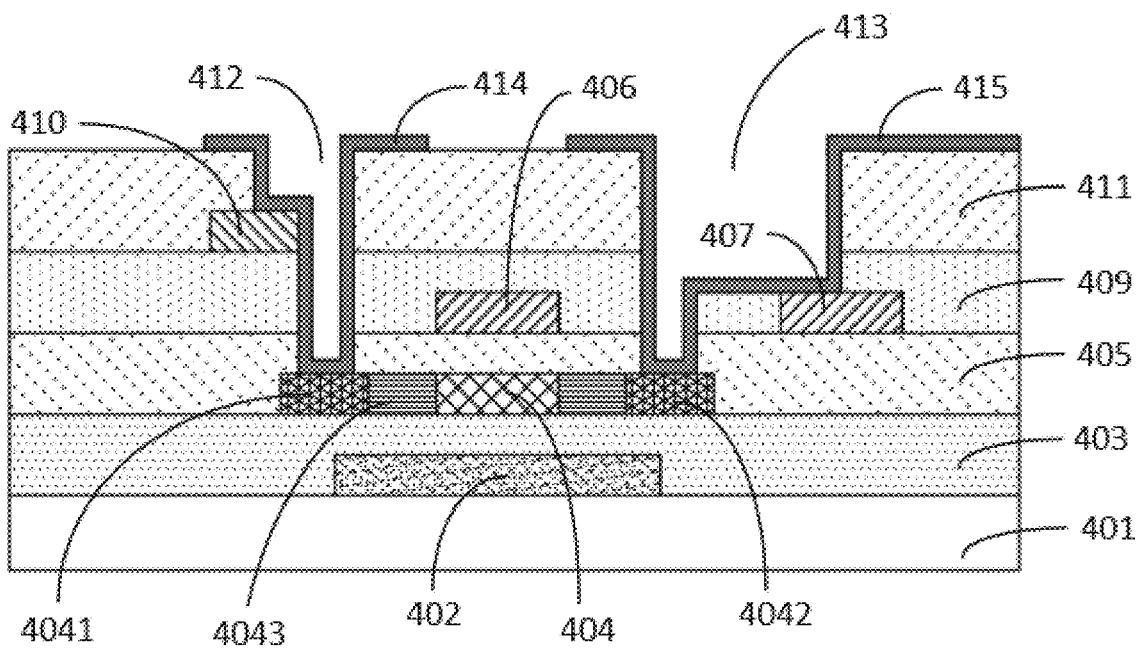
FIG. 6 is a schematic diagram showing a cross-sectional view of a structure of an LTPS type TFT according to a fourth embodiment of the present disclosure.

FIG. 6 is a schematic diagram showing a cross-sectional view of a structure of an LTPS type TFT according to a fourth embodiment of the present disclosure. The LTPS type TFT further includes a second gate electrode 407. The second gate electrode 407 and the first gate electrode 406 are formed from a metal layer at the same time.

The LTPS type TFT further includes a second contact hole 413. The second contact hole 413 passes through the third insulating layer 411, the second insulating layer 409, and a portion of the first insulating layer 405, and exposes the second heavily doped area 4042 and a portion of the second gate electrode 407.

The LTPS type TFT further includes a second transparent electrode 415. The second transparent electrode 415 and the first transparent electrode 414 are formed in a same process. A portion of the second gate electrode 407 is electrically connected to a portion of the second heavily doped area 4042 via the second transparent electrode 415.

The present disclosure provides an LTPS type TFT and a method for manufacturing the same. According to the present disclosure, the TFT includes a first contact hole and a second contact hole, where the first contact hole and the second contact hole pass through the third insulating layer, the second insulating layer, and a portion of the first insulating layer, such that a portion of the heavily doped area is exposed. In addition, a transparent electrode is electrically connected to the source/drain electrode or the second gate electrode and a portion of the heavily doped area. Therefore, quantity of masks used to form the contact hole is reduced, decreasing manufacturing time of a panel and decreasing manufacturing cost thereof.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a low temperature poly silicon (LTPS) type thin film transistor (TFT), comprising steps of:
   providing a substrate, and forming a silicon channel layer on the substrate;
   forming a first insulating layer on the silicon channel layer;
   forming a first gate electrode of the TFT on the first insulating layer;
   performing an ion implantation on a portion of the silicon channel layer to form a doped area, wherein the doped area includes a lightly doped area and a heavily doped area, and the heavily doped area includes a first heavily doped area and a second heavily doped area;
   forming a second insulating layer, a source/drain electrode, and a third insulating layer on the first gate electrode in sequence;
   forming a first contact hole on the LTPS type TFT, wherein the first contact hole exposes a portion of the source/drain electrode and a portion of the first heavily doped area; and
   forming a first transparent electrode on the third insulating layer, wherein the first transparent electrode is electrically connected to the portion of the source/drain electrode and the portion of the first heavily doped area via the first contact hole.

2. The method for manufacturing the LTPS type TFT according to claim 1, wherein the step of forming the silicon channel layer on the substrate comprises:
   providing the substrate, and forming a light-shielding film on the substrate;
   patterning the light-shielding film to form a light-shielding layer;
   forming a buffer layer on the light-shielding layer;
   forming a silicon channel film on the buffer layer; and
   patterning the silicon channel film to form the silicon channel layer.

3. The method for manufacturing the LTPS type TFT according to claim 1, wherein the first contact hole passes through the third insulating layer, the second insulating layer, and a portion of the first insulating layer, such that the portion of the first heavily doped area and the portion of the source/drain electrode are exposed.

4. The method for manufacturing the LTPS type TFT according to claim 1, wherein the LTPS type TFT further comprises a second gate electrode, and the second gate electrode and the first gate electrode are made of a same metal.

5. The method for manufacturing the LTPS type TFT according to claim 4, wherein the LTPS type TFT further comprises a second contact hole, and the second contact hole passes through the third insulating layer, the second insulating layer, and a portion of the first insulating layer, such that a portion of the second heavily doped area and a portion of the second gate electrode are exposed.

6. The method for manufacturing the LTPS type TFT according to claim 5, wherein the LTPS type TFT further comprises a second transparent electrode; and
   wherein the second contact hole exposes the portion of the second gate electrode and the portion of the second heavily doped area, and the portion of the second gate electrode is electrically connected to the portion of second the heavily doped area via the second transparent electrode.

7. A method for manufacturing a low temperature poly silicon (LTPS) type thin film transistor (TFT), comprising steps of:
   providing a substrate and forming a silicon channel layer on the substrate;
   forming a first insulating layer on the silicon channel layer;
   forming a first gate electrode of the TFT on the first insulating layer;
   performing an ion implantation on a portion of the silicon channel layer to form a doped area, and wherein the doped area includes a first doped area and a second doped area;
   forming a second insulating layer, a source/drain electrode, and a third insulating layer on the first gate electrode in sequence;
   forming a first contact hole on the LTPS type TFT, wherein the first contact hole exposes a portion of the source/drain electrode and a portion of the first doped area; and
   forming a first transparent electrode on the third insulating layer, wherein the first transparent electrode is electrically connected to the portion of the source/drain electrode and the portion of the first doped area via the first contact hole.

8. The method for manufacturing the LTPS type TFT according to claim 7, wherein the step of forming the silicon channel layer on the substrate comprises:
   providing the substrate, and forming a light-shielding film on the substrate;
   patterning the light-shielding film to form a light-shielding layer;
   forming a buffer layer on the light-shielding layer;
   forming a silicon channel film on the buffer layer; and
   patterning the silicon channel film to form the silicon channel layer.

9. The method for manufacturing the LTPS type TFT according to claim 7, wherein the first contact hole passes through the third insulating layer, the second insulating layer, and a portion of the first insulating layer, such that the portion of the first doped area and the portion of the source/drain electrode are exposed.

10. The method for manufacturing the LTPS type TFT according to claim 7, wherein the LTPS type TFT further comprises a second gate electrode, and the second gate electrode and the first gate electrode are made of a same metal.

11. The method for manufacturing the LTPS type TFT according to claim 10, wherein the LTPS type TFT further comprises a second contact hole, and the second contact hole passes through the third insulating layer, the second insulating layer, and a portion of the first insulating layer, such that a portion of the second doped area and a portion of the second gate electrode are exposed.

12. The method for manufacturing the LTPS type TFT according to claim 11, wherein the LTPS type TFT further comprises a second transparent electrode; and wherein the second contact hole exposes the portion of the second gate electrode and the portion of the second doped area, and the portion of the second gate electrode is electrically connected to the portion of the second doped area via the second transparent electrode.

* * * * *